(12) United States Patent
Kumar et al.

(10) Patent No.: US 10,949,258 B1
(45) Date of Patent: Mar. 16, 2021

(54) MULTISTAGE ROUND ROBIN ARBITRATION IN A MULTIUSER SYSTEM

(71) Applicant: Xilinx, Inc., San Jose, CA (US)

(72) Inventors: Tejinder Kumar, Moga (IN); Surender Kisanagar, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/700,311

(22) Filed: Dec. 2, 2019

(51) Int. Cl.
| | | |
|---|---|---|
| G06F 9/48 | (2006.01) | |
| G06F 13/37 | (2006.01) | |
| G06F 13/364 | (2006.01) | |
| H03K 19/173 | (2006.01) | |
| H03K 19/20 | (2006.01) | |

(52) U.S. Cl.
CPC .......... *G06F 9/4881* (2013.01); *G06F 13/364* (2013.01); *G06F 13/37* (2013.01); *H03K 19/1737* (2013.01); *H03K 19/20* (2013.01)

(58) Field of Classification Search
CPC ........ G06F 9/4881; G06F 9/50; G06F 9/5005; G06F 9/5011; G06F 9/5016; G06F 13/362; G06F 13/364; G06F 13/37; H03K 19/1737; H03K 19/20
See application file for complete search history.

(56) References Cited

U.S. PATENT DOCUMENTS

| | | | | |
|---|---|---|---|---|
| 5,519,837 A | * | 5/1996 | Tran | G06F 13/364 370/462 |
| 5,832,278 A | * | 11/1998 | Pham | G06F 13/364 710/243 |
| 7,236,497 B2 | * | 6/2007 | Kurupati | H04L 47/50 370/447 |
| 7,710,996 B1 | * | 5/2010 | Damaraju | H04L 47/60 370/461 |
| 2003/0172212 A1 | * | 9/2003 | Lavigne | G06F 13/364 710/111 |
| 2004/0243752 A1 | * | 12/2004 | O'Connor | G06F 13/364 710/243 |
| 2005/0138254 A1 | * | 6/2005 | Raghavan | G06F 13/37 710/240 |
| 2011/0321053 A1 | * | 12/2011 | Ambroladze | G06F 13/14 718/103 |

* cited by examiner

*Primary Examiner* — Thomas J. Cleary
(74) *Attorney, Agent, or Firm* — Patterson + Sheridan, LLP

(57) ABSTRACT

A device includes a first and a second stage round robin arbitrations receiving request signals associated with a first, a second and a third user. At least one request signal for each of the first, the second, and the third user is asserted to access a common resource. The first stage round robin arbitration selects the first, the second, and the third user in a round robin fashion, at a first, a second, and a third iteration. The second stage round robin arbitration receives the user selection and the plurality of request signals and at the first, the second, and the third iteration grants access to the common resource to one request signal associated with the first, the second, and the third user. At each subsequent iteration the first stage round robin arbitration selects a different user and grants access to another request signal until all request signals are processed.

19 Claims, 10 Drawing Sheets

MULTISTAGE ROUND ROBIN ARBITRATION IN A MULTIUSER SYSTEM

TECHNICAL FIELD

The disclosure generally relates to an arbitration scheme to grant access to a common resource and more particularly a round robin arbitration scheme to grant access to a common resource.

BACKGROUND

A round robin scheme is generally used to grant access to a common resource. For example, round robin arbiters are generally used to arbitrate among multiple request signals. Recently system performance has improved by using high numbers of queues and further by using a larger queue size. In some conventional systems scanning arbiters may be used to facilitate access grants as quickly as possible. However, scanning arbiters suffer from high latency as the number of request signals increase. Furthermore, scanning arbiters result in reduced clock frequency when the window size is increased to reduce latency.

SUMMARY

Accordingly, a need has arisen to provide an arbitration scheme that is both high speed and low latency. A multistage round robin arbitration architecture is proposed that is both high speed and has lower latency in comparison to the conventional architecture. The proposed architecture supports pipelining to improve performance, thereby resulting in an increased operating clock frequency. Moreover, the proposed architecture results in lower latency when arbitrating among a large number of request signals and queues. Furthermore, the proposed architecture supports round robin arbitration among multiple users in a fair fashion such that, unlike the conventional method, not all request signals from the same user being processed before processing request signals from another user, rather processing a request signal from one user and processing another request signal from another user in a round robin fashion until all users and all requests signals are processed in a fair fashion.

In some embodiments, the proposed multistage round robin arbitration architecture includes a first logic gate and a second logical gate, corresponding to a first user and a second user, configured to receive a first and second plurality of request signals respectively. Each request signal indicates whether a component is requesting access to a common resource. Each logical gate is configured to output a signal indicating whether a user corresponding to that logical gate is requesting access to the common resource. The device further includes a first round robin arbiter configured to receive output signals from the first and the second logical gates and to output an index signal identifying the first logical gate when the output signal of the first and the second logical gates is each asserted to access the common resource. The device also includes a multiplexer configured to receive the first and second plurality of request signals and the index signal and wherein the multiplexer selects the first plurality of request signals based on the index signal. The device also includes a second round robin arbiter configured to receive the first plurality of request signals from the multiplexer and grant access to the common resource to one request signal of the first plurality of request signals. The first round robin arbiter is further configured to update the index signal identifying the second logical gate, and wherein the multiplexer selects the second plurality of request signals based on the updated index signal. The second round robin arbiter is further configured to receive the second plurality of request signals based on the updated index signal from the multiplexer and grants access to the common resource to one request signal of the second plurality of request signals. Alternate selection of the first and the second plurality of request signals by the first round robin arbiter repeats until all request signals asserted to access the common resource have been granted access to the common resource.

In some embodiments, the first logical gate comprises a logical OR gate. The device may further include a memory configured to store data associated with the one request signal of the first plurality of request signals that has been granted access to the common resource. The second round robin arbiter is configured to access the stored data and to grant access to another one request signal of the first plurality of request signals that is asserted to access the common resource when the first round robin arbiter identifies the first logical gate again. It is appreciated that the another one request signal of the first plurality of request signals that is asserted to access the common resource is a request signal that has not been granted access to the common resource and is waiting for access grant.

In some embodiments, the memory is further configured to store data associated with the one request signal of the second plurality of request signals that has been granted access to the common resource. The second round robin arbiter is configured to access the stored data and to grant access to another one request signal of the second plurality of request signals that is asserted to access the common resource when the first round robin arbiter identifies the second logical gate again. It is appreciated that the another one request signal of the second plurality of request signals that is asserted to access the common resource is a request signal that has not been granted access to the common resource and is waiting for access grant.

In some embodiments, the first round robin arbiter is configured to receive an enable signal to initiate round robin arbitration. The first round robin arbiter is configured to output a notification signal to the second round robin arbiter to notify the second round robin arbiter that the first round robin arbiter has completed a current round robin arbitration processing and to initiate a round robin processing by the second round robin arbiter. According to some embodiments, the common resource is selected from a group consisting of a bus, storage memory, and network cards.

In some embodiments, a device includes a first and a second stage round robin arbitration. The first stage round robin arbitration is configured to receive a first, a second, and a third plurality of request signals associated with a first, a second and a third user respectively, wherein at least one request signal for each of the first, the second, and the third user is asserted to access a common resource, and wherein the first stage round robin arbitration is configured to select the first, the second, and the third user in a round robin fashion, at a first, a second, and a third iteration. The second stage round robin arbitration is configured to receive the user selection by the first stage round robin arbitration and further configured to receive the plurality of request signals associated therewith and wherein the during the first, the second, and the third iteration one request signal associated with the first, the second, and the third user respectively is granted access to the common resource. It is appreciated that the first stage round robin arbitration is configured to select the first user subsequent to the third iteration if the first plurality of request signals associated with the first user includes a request signal that is asserted to access the common resource and has not been granted access to the common resource. It is further appreciated that the second stage round robin arbitration is further configured to grant access to the request signal of the first plurality of request signals that is asserted and has not been granted access. In some embodiments, the first stage round robin arbitration is configured to select the second user subsequent to the third iteration if the second plurality of request signals associated with the second user includes a request signal that is asserted and has not been granted access to the common resource. The second stage round robin arbitration is further configured to grant access to the request signal of the second plurality of request signals that is asserted and has not been granted access.

In some embodiments, the first stage round robin arbitration is configured to select the third user immediately after the third iteration if the third plurality of request signals associated with the third user includes a request signal that is asserted and has not been granted access to the common resource and if request signals from the first and the second users contain no request signal asserted that has not been granted access to the common resource. The second stage round robin arbitration is further configured to grant access to the request signal of the third plurality of request signals that is asserted and has not been granted access.

According to some embodiments, the device further includes a memory configured to store data associated with a request signal that was granted access to the common resource by the second stage round robin arbitration. The second stage round robin arbitration is configured to access the stored data and to grant access to a next request signal associated with a user that is asserted to access the common resource wherein the next request signal is different from prior request signals that were granted access to the common resource.

In one illustrative embodiment, the first stage round robin arbitration includes a plurality of logical gates, a round robin arbiter, and a multiplexer. The plurality of logical gates is configured to receive the first, the second, and the third plurality of request signals and output a plurality of logical output signals, wherein each logical gate of the plurality of logical gates receives a request signals associated with one user. The round robin arbiter is configured to receive the plurality of logical output signals and selects one logical output at a time in a round robin fashion that includes a request signal that is asserted to access the common resource. The multiplexer is configured to receive the selection by the round robin arbiter and transmit the request signals corresponding to the selection to the second stage round robin arbitration. In some embodiments, the plurality of logical gates includes a logical OR gate. According to some embodiments, the common resource is selected from a group consisting of a bus, storage memory, and network cards. It is appreciated that in some embodiments, the first stage round robin arbitration transmits a notification signal to the second stage round robin arbitration to notify the second stage round robin arbitration that the first stage round robin arbitration has completed a current round robin arbitration processing and to initiate a round robin processing by the second stage round robin arbitration.

In some embodiments a method includes receiving a first, a second, and a third plurality of request signals associated with a first, a second, and a third user, respectively. At a first iteration, the first plurality of request signals associated with the first user is selected if it includes at least a request signal that is asserted to access the common resource. At the first iteration, the second plurality of request signals associated with the second user is selected if it includes at least a request signal that is asserted to access the common resource and if the first plurality of request signals includes no request signal that is asserted to access the common resource. At the first iteration, the third plurality of request signals associated with the third user is selected if it includes at least a request signal that is asserted to access the common resource and if the first and the second plurality of request signals include no request signal that is asserted to access the common resource. One request signal of the selected plurality of request signals is granted access to the common resource. Information associated with the request signal that was granted access to the common resource is stored, e.g., the request signal index, the user associated with the request signal, etc. The stored information is accessed to ensure that the request signal that was granted access is not granted access again and to ensure that the next request signal asserted to access the common resource is granted access. At a second iteration, another set of plurality of request signals associated with a user that was not selected at the first iteration is selected if the another set of plurality of request signals includes a request signal that is asserted to access the common resource. One request signal from the selected request signals is granted access to the common resource. At the second iteration, the same set of request signals as the first iteration may be selected if no other request signals associated with other users include a request signal that is asserted to access the common resource. At the second iteration, another one request signal of the selected request signals, e.g., same request signals as selected in the first iteration, is granted access to the common resource. The storing and retrieving the information is repeated for the request signal that was granted access to the common resource. Another set of plurality of request signals associated with a different user that was not selected in the second iteration is selected if the another set of plurality of request signals includes at least one request signal that is asserted to access a common resource. At the third iteration, access to the common resource is granted to one request signal of the request signals selected.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
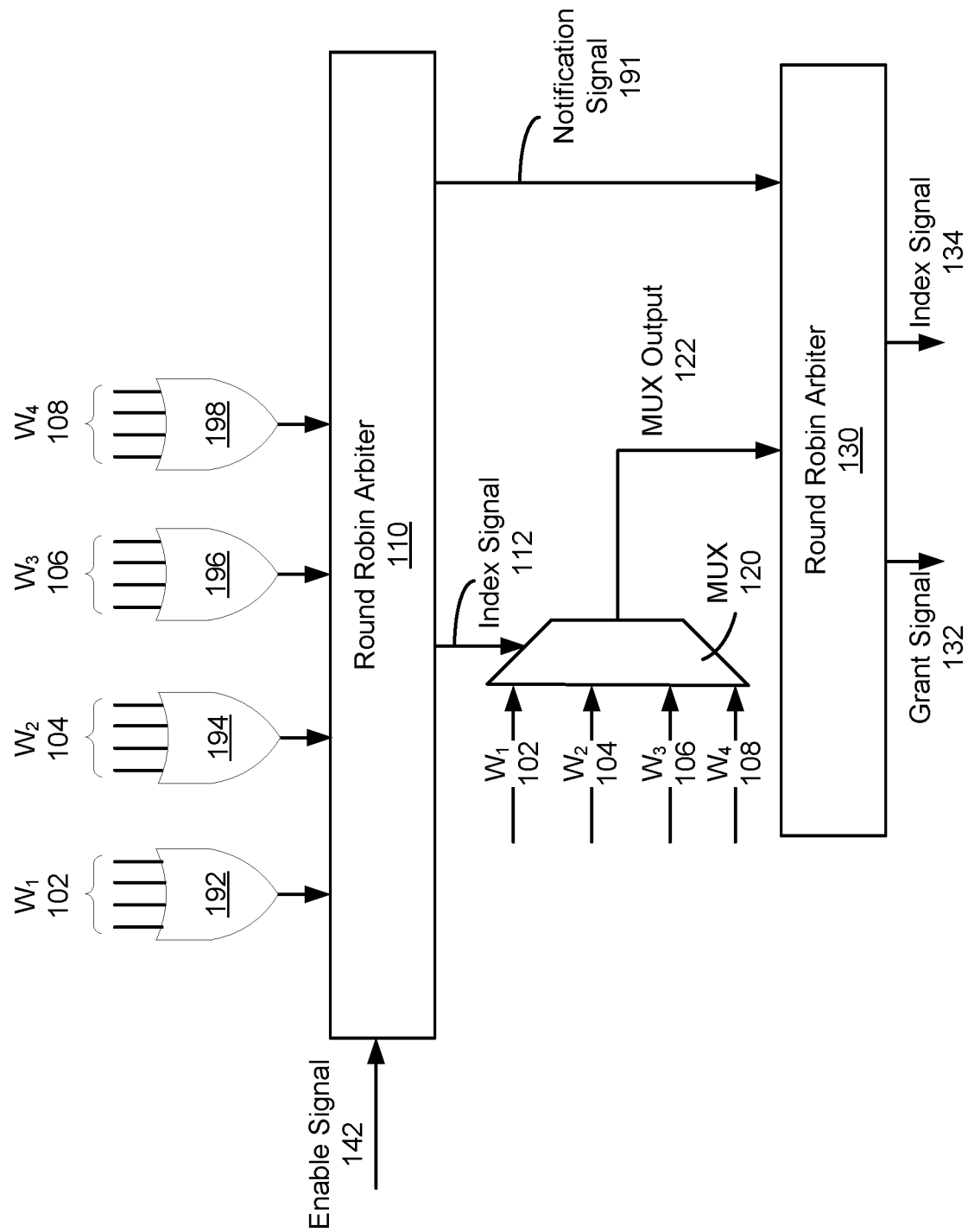
FIGS. 1A-1B show a block diagram depicting arbitration architecture, according to some examples.

Examples described herein relate to a multistage round robin arbitration architecture to grant access to a common resource, e.g., system buses, storage memories, network cards, processors, etc. Round robin arbitration architecture is a key component in defining the latency and performance of the system. The proposed multistage round robin arbitration architecture may be used regardless of the number of queues and the queue sizes and the number of request signals while achieving reduced latency and increased operating clock frequency. The proposed multistage round robin arbitration architecture achieves both higher speed and lower latency in comparison to the conventional architecture. The proposed architecture supports pipelining to improve performance, thereby resulting in an increased operating clock frequency. Moreover, the proposed architecture results in lower latency when arbitrating among a large number of request signals and queues. Furthermore, the proposed architecture supports round robin arbitration among multiple users in a fair fashion such that, unlike the conventional method, not all request signals from the same user being processed before processing request signals from another user, rather processing a request signal from one user and processing another request signal from another user in a round robin fashion until all users and all requests signals are processed in a fair fashion.

It is appreciated that while round robin architecture is described the proposed architecture may be extended to other types of arbitration schemes, e.g., priority arbitration, using a similar architecture. As such, description of the multistage arbitration architecture in a round robin fashion is for illustrative purposes only and should not be construed as limiting the scope of the embodiments.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

Figure 1B:
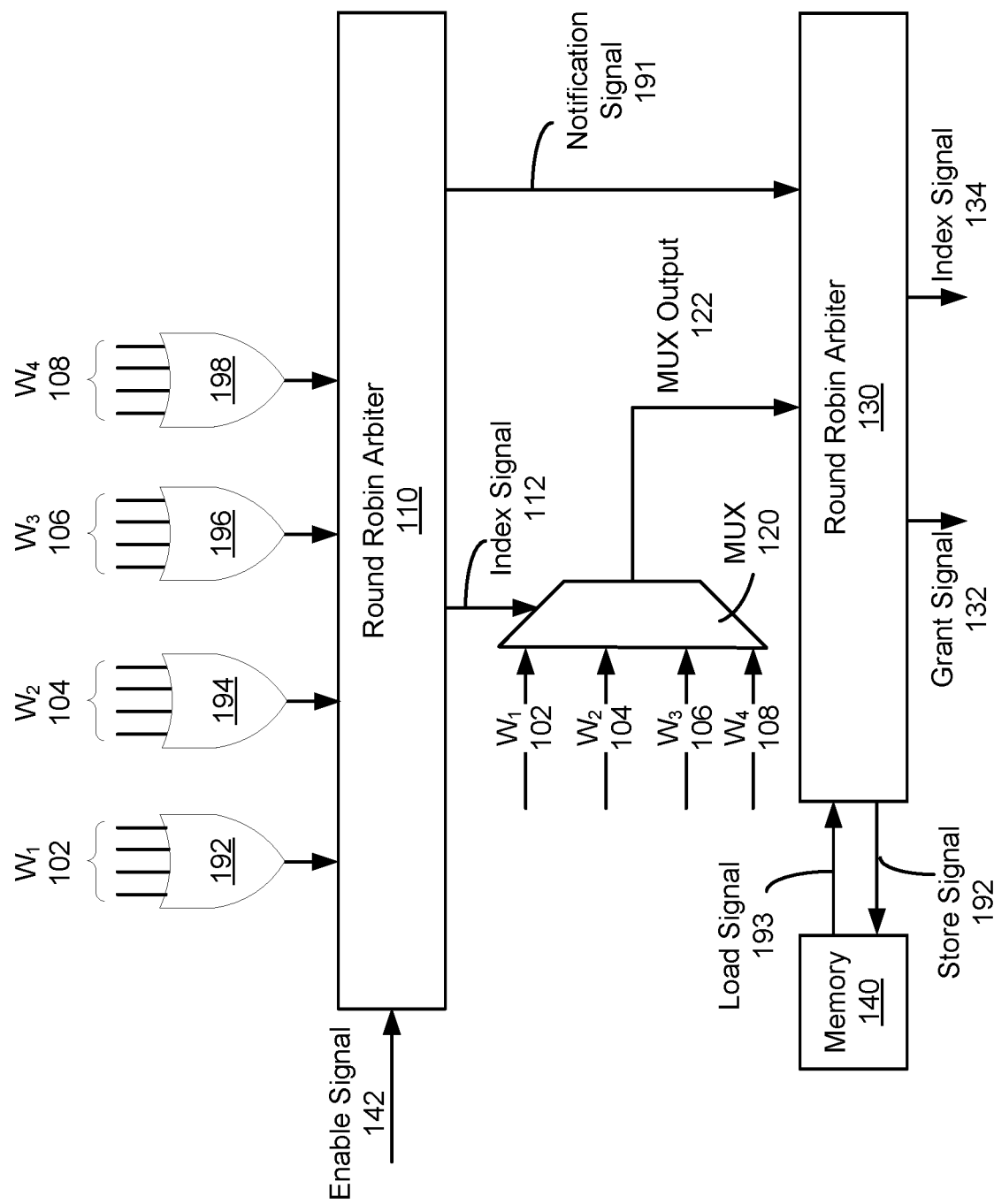

Referring now to FIGS. 1A-1B, a block diagram depicting arbitration architecture, according to some examples is shown. In the proposed architecture, a plurality of logical gates, e.g., OR logical gates 192, 194, 196, and 198, receives a plurality of request signals. The request signals may be received as a group or may have been grouped together as words, e.g., $W_1$ 102, $W_2$ 104, $W_3$ 106, and $W_4$ 108. It is appreciated that in some embodiments, the grouping may be done to improve performance and efficiency and/or it may be based on priority associated with the request signals. The received request signals are request signals from a component to access a common resource, e.g., system bus, storage memories, network cards (e.g., NIC cards), processor, etc.

It is appreciated that in the illustrated example, the request signals are grouped together based on which users they are coming from. For example, all request signals from a first user are grouped together, e.g., user 1 requests are grouped as $W_1$ 102. Similarly all request signals from a second user are grouped together, e.g., user 2 requests are grouped as $W_2$ 104. Moreover, all request signals from a third user are grouped together, e.g., user 3 requests are grouped as $W_3$ 106 while request signals from user 4 are grouped together as $W_4$ 108.

It is appreciated that the number of users discussed is for illustration purposes only and should not be construed as limiting the scope of the embodiments. Moreover, it is appreciated that the number of request signals for each user may vary and illustrating 4 request signals per user is for illustrative purposes and should not be construed as limiting the scope of the embodiments. For example, a first user may have 2 request signals while a second user may have 5 request signals, user three may have 12 request signals, and so and so forth.

In some embodiments, each logical component outputs a signal indicative of whether at least one request signal within the received word associated with a corresponding user is asserted indicating that a component associated with that request signal is requesting access to the common resource. For example, in this illustrative embodiment, the logical OR gate 192 receives the word $W_1$ 102 that is a grouping of four request signals for the first user. Each request signal of the word $W_1$ 102 is associated with its corresponding component in the system corresponding to the first user and if the associated request signal is asserted high it indicates that the corresponding component is requesting access to the common resource. Accordingly, if any one of the four request signals in $W_1$ 102 is asserted high, the logical OR gate 192 outputs a signal that is high indicating that at least one component corresponding to a request signal within $W_1$ 102 is requesting access to the common resource. In contrast, if none of the request signals within the $W_1$ 102 is asserted high, the logical OR gate 192 outputs a signal that is asserted low indicating that no component corresponding to the request signals within $W_1$ 102 is requesting access to the common resource. It is appreciated that other logical gates similarly output a corresponding signal for their respective received word corresponding to their respective users. It is appreciated that only 4 logical OR gates with four inputs are shown. However, it is appreciated that any number of OR gates with any number of inputs may be used. Even further, other embodiments may use a logical gate other than an OR gate. As such, any discussion with respect to the number of logical gates, the OR gate, and the number of inputs is for illustrative purposes and not intended to limit the scope of the embodiments.

For illustrative purposes it is presumed that the first, third, and fourth request signals of $W_1$ 102 are asserted high. It is further presumed that none of the request signals associated with $W_2$ 104 and $W_3$ 106 are asserted high. For illustrative purposes it is presumed that the first and the fourth request signals of $W_4$ 108 are asserted high.

In some embodiments, the logical gates 192-198 output their respective signals to a round robin arbiter 110. In this illustrative embodiment, the round robin arbiter is a 4:2 where it receives four inputs and outputs a signal with 2 bits. The round robin arbiter 110 on the first pass may select the first output signal from the logical OR gates that is asserted high. For example, presuming for the purposes of this illustration that logical OR gate 192 outputs a signal asserted high indicating that at least one request signal within the $W_1$ 102 is requesting access to the common resource, but that logical OR gates 194 and 196 output a signal asserted low indicating that no component associated with those request signals is requesting access to the common resource, and finally the logical OR gate 198 outputs a signal asserted high indicating that at least one request signal within the $W_4$ 108 is requesting access to the common resource. The round robin arbiter 110 receives a global enable signal 142 that when asserted indicates that arbitration is requested. The round robin arbiter 110 may select the logical OR gate 192 because it is the first one in the grouping of the logical OR gates with an output signal asserted high. However, it is appreciated that in some embodiments, a different ordering selection may be done, e.g., the round robin arbiter 110 may select the logical OR gate 198 first.

In some embodiments, the round robin arbiter 110 may output an index signal 112 that identifies the logical OR gate 192 and the request signals in $W_1$ 102. Since the round robin arbiter 110 is a 4 input arbiter, it may use two bits to identify the logical OR gate. In this illustrative example, 00 may be used to identify logical OR gate 192 and its corresponding $W_1$ 102, 01 may be used to identify logical OR gate 194 and its corresponding $W_2$ 104, 10 may be used to identify logical OR gate 196 and its corresponding $W_3$ 106, and 11 may be used to identify logical OR gate 198 and its corresponding $W_4$ 108. In this illustrative example, the index signal 112 outputs a 00 value indicating the logical OR gate 192 and its corresponding $W_1$ 102.

In some embodiments, a multiplexer 120 may receive the index signal 112 to select between the different words, $W_1$ 102, $W_2$ 104, $W_3$ 106, and $W_4$ 108. In this illustrative example, since the index signal 112 has a 00 value, the word $W_1$ 102 is selected. The multiplexer 120 outputs a signal 122 which is the selected word, e.g., $W_1$ 102.

In some embodiments, a second round robin arbiter 130 may be used and receives the mux output signal 122. The second round robin arbiter 130 also receives a notification signal 191 from the first round robin arbiter 110 notifying it at the first round robin arbiter 110 has completed its processing. In this example, the MUX output signal 122 is $W_1$ 102. The round robin arbiter 130 processes the requests within the $W_1$ 102. For illustrative purpose it is presumed that 3 of the 4 request signals within $W_1$ 102 are asserted high indicating that their respective components are requesting access to the common resource, e.g., the first, third, and fourth request signals are asserted high for illustrative purposes. Since the words are groups of 4 request signals, then the round robin arbiter 130 may use 2 bits to identify the request signal and its corresponding component. For example, 00 may be used to identify the first request signal within $W_1$ 102 and its corresponding component, 01 may be used to identify the second request signal within $W_1$ 102 and its corresponding component, 10 may be used to identify the third request signal within $W_1$ 102 and 11 may be used to identify the first request signal within $W_1$ 102 and its corresponding component.

In some embodiments, the round robin arbiter 130 outputs an index signal 134 with values 00 corresponding to the first request signal of $W_1$ 102 being asserted high. As such, the component corresponding to the first request signal is granted access to the common resource by issuing grant signal 132. It is appreciated that there may be a mechanism to track which request signal for the user has been processed. In this example, it may be tracked that the first request signal of $W_1$ 102 has been processed.

It is appreciated that while the round robin arbiter 130 is processing the request, the round robin arbiter 110 may process the next request signal for the next user. As presented above and for illustrative purposes it was presumed that words $W_2$ 104 and $W_3$ 106 have no request signals that are asserted high indicative of an access grant request to the common resource, the round robin arbiter 110 selects the next word with at least one request signal being asserted high, e.g., $W_4$ 108, because the output of the OR logic gate 198 is asserted high indicating that at least one request signal within $W_4$ 108 is asserted high.

In some embodiments, the round robin arbiter 110 may output an index signal 112 that identifies the logical OR gate 198 and the request signals in $W_4$ 108. In this illustrative example, the index signal 112 outputs a 11 value indicating the logical OR gate 198 and its corresponding $W_4$ 108.

In some embodiments, a multiplexer 120 may receive the index signal 112 to select between the different words, $W_1$ 102, $W_2$ 104, $W_3$ 106, and $W_4$ 108. In this illustrative example, since the index signal 112 has a 11 value, the word $W_4$ 108 is selected. The multiplexer 120 outputs a signal 122 which is the selected word, e.g., $W_4$ 108.

In some embodiments, the round robin arbiter 130 receives the output signal 122. In this example, the MUX output signal 122 is $W_4$ 108. Moreover, the round robin arbiter 130 receives the notification signal 191 from the first round robin arbiter 110 that it has completed processing and to initiate the second round robin arbiter 130 to begin processing. The round robin arbiter 130 processes the requests within the $W_4$ 108. For illustrative purpose it is presumed that 2 of the 4 request signals within $W_4$ 108 are asserted high indicating that their respective components are requesting access to the common resource, e.g., the first and third request signals are asserted high for illustrative purposes. Since the words are groups of 4 request signals, then the round robin arbiter 130 may use 2 bits to identify the request signal and its corresponding component. For example, 00 may be used to identify the first request signal within $W_4$ 108 and its corresponding component, 01 may be used to identify the second request signal within $W_4$ 108 and its corresponding component, 10 may be used to identify the third request signal within $W_4$ 108 and 11 may be used to identify the first request signal within $W_4$ 108 and its corresponding component.

In some embodiments, the round robin arbiter 130 outputs an index signal 134 with values 00 corresponding to the first request signal of $W_4$ 108 being asserted high. As such, the component corresponding to the first request signal is granted access to the common resource by issuing grant signal 132. As discussed above, there is a mechanism to track which request signal for the user has been processed. In this example, it may be tracked that the first request signal of $W_4$ 108 has been processed.

It is appreciated that while the round robin arbiter 130 is processing the request, the round robin arbiter 110 may process the next request signal for the next user that is asserted high. As such, the round robin arbiter 110 selects the next word $W_1$ 102 because there are no other logical OR gates after logical OR 198 and further that the output of the logic OR gate 192 is asserted high indicating that at least one request signal within the $W_1$ 102 is asserted high. In other words, the round robin arbiter 110 loops back to the first user.

In some embodiments, the round robin arbiter 110 may output an index signal 112 that identifies the logical OR gate 192 and the request signals in $W_1$ 102. Since the round robin arbiter 110 is a 4 input arbiter, it may use two bits to identify the logical OR gate. In this illustrative example, 00 may be used to identify logical OR gate 192. In this illustrative example, the index signal 112 outputs a 00 value indicating the logical OR gate 192 and its corresponding $W_1$ 102.

In some embodiments, a multiplexer 120 may receive the index signal 112 to select between the different words, $W_1$ 102, $W_2$ 104, $W_3$ 106, and $W_4$ 108. In this illustrative example, since the index signal 112 has a 00 value, the word $W_1$ 102 is selected. The multiplexer 120 outputs a signal 122 which is the selected word, e.g., $W_1$ 102.

In some embodiments, the second round robin arbiter 130 may be used and receives the mux output signal 122. The second round robin arbiter 130 also receives a notification signal 191 from the first round robin arbiter 110 notifying it that the first round robin arbiter 110 has completed its processing (e.g. processing $W_1$ 102). In this example, the MUX output signal 122 is $W_1$ 102. The round robin arbiter 130 processes the requests within the $W_1$ 102. As presented above there is a mechanism to track which request signal for each word was processed last, e.g., in this instance the first request signal for $W_1$ 102 that was asserted high was processed. The tracking may be through various means, e.g., using index such as 00 to identify the first request signal within word $W_1$ 102. Accordingly, the second round robin arbiter 130 selects the next request signal that is asserted high, in this instance, third request signal as identified by index 10. Thus, the round robin arbiter 130 outputs an index signal 134 with values 10 corresponding to the third request signal of $W_1$ 102 being asserted high. As such, the component corresponding to the third request signal is granted access to the common resource by issuing grant signal 132. It is appreciated that there may be a mechanism to track which request signal for the user has been processed, as discussed above. In this example, it may be tracked that the third request signal of $W_1$ 102 has been processed.

It is appreciated that while the round robin arbiter 130 is processing the request, the round robin arbiter 110 may process the next request signal for the next user. As presented above and for illustrative purposes it was presumed that words $W_2$ 104 and $W_3$ 106 have no request signals that are asserted high indicative of an access grant request to the common resource, the round robin arbiter 110 selects the next word with at least one request signal being asserted high, e.g., $W_4$ 108, because the output of the OR logic gate 198 is asserted high indicating that at least one request signal within $W_4$ 108 is asserted high. In other words, the round robin arbiter 110 loops back to the fourth user.

In some embodiments, the round robin arbiter 110 may output an index signal 112 that identifies the logical OR gate 198 and the request signals in $W_4$ 108. In this illustrative example, the index signal 112 outputs a 11 value indicating the logical OR gate 198 and its corresponding $W_4$ 108.

In some embodiments, a multiplexer 120 may receive the index signal 112 to select between the different words, $W_1$ 102, $W_2$ 104, $W_3$ 106, and $W_4$ 108. In this illustrative example, since the index signal 112 has a 11 value, the word $W_4$ 108 is selected. The multiplexer 120 outputs a signal 122 which is the selected word, e.g., $W_4$ 108.

In some embodiments, the round robin arbiter 130 receives the output signal 122. In this example, the MUX output signal 122 is $W_4$ 108. Moreover, the round robin arbiter 130 receives the notification signal 191 from the first round robin arbiter 110 that it is complete processing (e.g. processing $W_4$ 108) and to initiate the second round robin arbiter 130 to begin processing. The round robin arbiter 130 processes the requests within the $W_4$ 108. The round robin arbiter 130 processes the requests within the $W_4$ 108. As presented above there is a mechanism to track which request signal for each word was processed last, e.g., in this instance the first request signal for $W_4$ 108 that was asserted high was processed. The tracking of may be through various means, e.g., using index such as 00 to identify the first request signal within word $W_4$ 108. Accordingly, the second round robin arbiter 130 selects the next request signal that is asserted high, in this instance, fourth request signal as identified by index 11. Thus, the round robin arbiter 130 outputs an index signal 134 with values 11 corresponding to the fourth request signal of $W_4$ 108 being asserted high. As such, the component corresponding to the fourth request signal is granted access to the common resource by issuing grant signal 132. It is appreciated that there may be a mechanism to track which request signal for the user has been processed, as discussed above. In this example, it may be tracked that the fourth request signal of $W_4$ 108 has been processed.

It is appreciated that while the round robin arbiter 130 is processing the request, the round robin arbiter 110 may process the next request signal for the next user. As presented above and for illustrative purposes it was presumed that words $W_2$ 104 and $W_3$ 106 have no request signals that is asserted high indicative of an access grant request to the common resource, the round robin arbiter 110 selects the next word with at least one request signal being asserted high, e.g., $W_1$ 102, because the output of the OR logic gate 192 is asserted high indicating that at least one request signal within $W_1$ 102 is asserted high. In other words, the round robin arbiter 110 loops back to the first user.

In some embodiments, the round robin arbiter 110 may output an index signal 112 that identifies the logical OR gate 192 and the request signals in $W_1$ 102. In this illustrative example, the index signal 112 outputs a 00 value indicating the logical OR gate 192 and its corresponding $W_1$ 102.

In some embodiments, a multiplexer 120 may receive the index signal 112 to select between the different words, $W_1$ 102, $W_2$ 104, $W_3$ 106, and $W_4$ 108. In this illustrative example, since the index signal 112 has a 00 value, the word $W_1$ 102 is selected. The multiplexer 120 outputs a signal 122 which is the selected word, e.g., $W_1$ 102.

In some embodiments, the round robin arbiter 130 receives the output signal 122. In this example, the MUX output signal 122 is $W_1$ 102. Moreover, the round robin arbiter 130 receives the notification signal 191 from the first round robin arbiter 110 that it is complete processing (e.g. processing $W_1$ 102) and to initiate the second round robin arbiter 130 to begin processing. The round robin arbiter 130 processes the requests within the $W_1$ 102. As presented above there is a mechanism to track which request signal for each word was processed last, e.g., in this instance the third request signal for $W_1$ 102 that was asserted high was processed. The tracking of may be through various means, e.g., using index such as 10 to identify the third request signal within word $W_1$ 102. Accordingly, the second round robin arbiter 130 selects the next request signal that is asserted high, in this instance, fourth request signal as identified by index 11. Thus, the round robin arbiter 130 outputs an index signal 134 with values 11 corresponding to the fourth request signal of $W_1$ 102 being asserted high. As such, the component corresponding to the fourth request signal is granted access to the common resource by issuing grant signal 132. It is appreciated that there may be a mechanism to track which request signal for the user has been processed, as discussed above. In this example, it may be tracked that the fourth request signal of $W_1$ 102 has been processed. It is appreciated that the process as described is repeated until all request signals that are asserted high from different users are processed and granted access. In this illustrative example, there are no other request signals that are asserted high and therefore the process stops. For example, the process may go back to round robin arbiter 110 and outputs index signal 112 corresponding to $W_4$ 108 since the next logical OR gate with an output asserted high corresponds to $W_4$ 108. However, once the second arbiter 130 processes $W_4$ 108 it is determined that all request signals are processed and therefore the process stops.

It is appreciated that describing the embodiments with two stage round robin arbiters, four logical OR gates, and four words along with one multiplexer is for illustrative purposes only and should not be construed as limiting the scope of the embodiments.

Referring now to FIG. 1B an architecture similar to that of FIG. 1A is shown. In this embodiment, the mechanism to track which request signal associated with a user has been processed is shown. In this embodiment, a memory component 140 may be used. The round robin arbiter 130 may transmit a store signal 195 to the memory component identifying the request signal and the user that was just granted access. For example, when the round robin arbiter 130 is processing the first request signal of the word $W_1$ 102, the store signal 195 may transmit 00 for identifying the first user and further transmit 00 to identify the first request signal. In contrast, if the round robin arbiter 130 is processing the third request signal of the word $W_1$ 102, the store signal 195 may transmit 00 for identifying the first user and further transmit 10 to identify the third request signal. Similarly, when the round robin arbiter 130 is processing the fourth request signal of the word $W_1$ 102, the store signal 195 may transmit 00 for identifying the first user and further transmit 11 to identify the fourth request signal. It is appreciated that when the round robin arbiter 130 is processing the first request signal of the word $W_4$ 108, the store signal 195 may transmit 11 for identifying the fourth user and further transmit 00 to identify the first request signal. In contrast, if the round robin arbiter 130 is processing the fourth request signal of the word $W_4$ 108, the store signal 195 may transmit 11 for identifying the fourth user and further transmit 11 to identify the fourth request signal. It is appreciated that other methods to convey the information may similarly be employed and the embodiments should not be construed as limited to specific orderings of the bits, as described.

It is appreciated that once the information conveyed by the store signal 195 is stored in the memory 140 and once another notification signal 191 is received, the information stored in the memory 140 is loaded onto the round robin arbiter 130. For example, the information stored in the memory 140 may be loaded using load signal 193. As such, the arbiter 130 is able to identify the last request signal processed for each user, hence process the next request signal of the selected user, as identified by the first round robin arbiter 110.

Figure 2A:
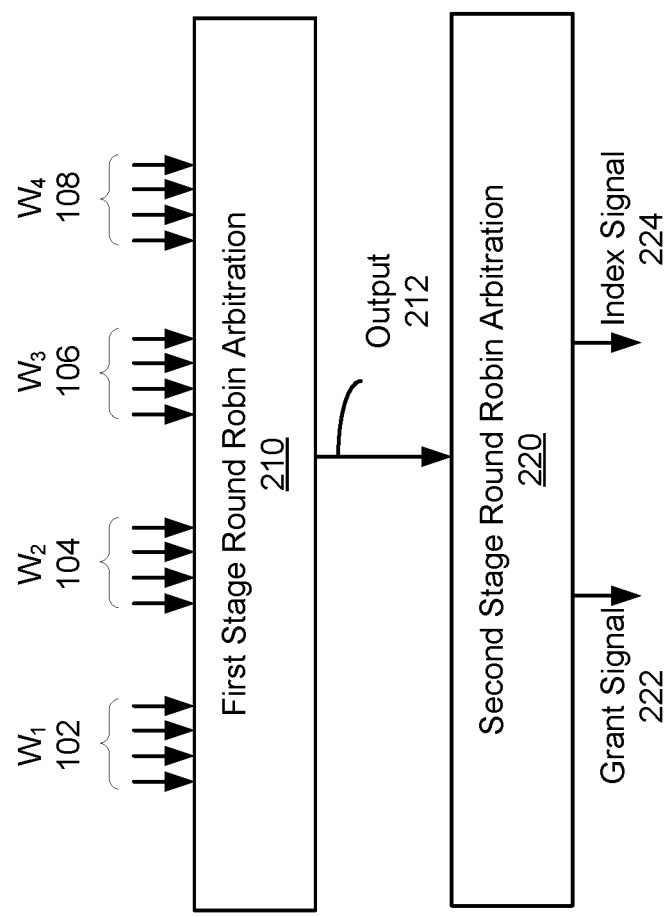
FIGS. 2A-2B show illustrative two stage arbitration architecture, according to some examples.
Figure 2B:
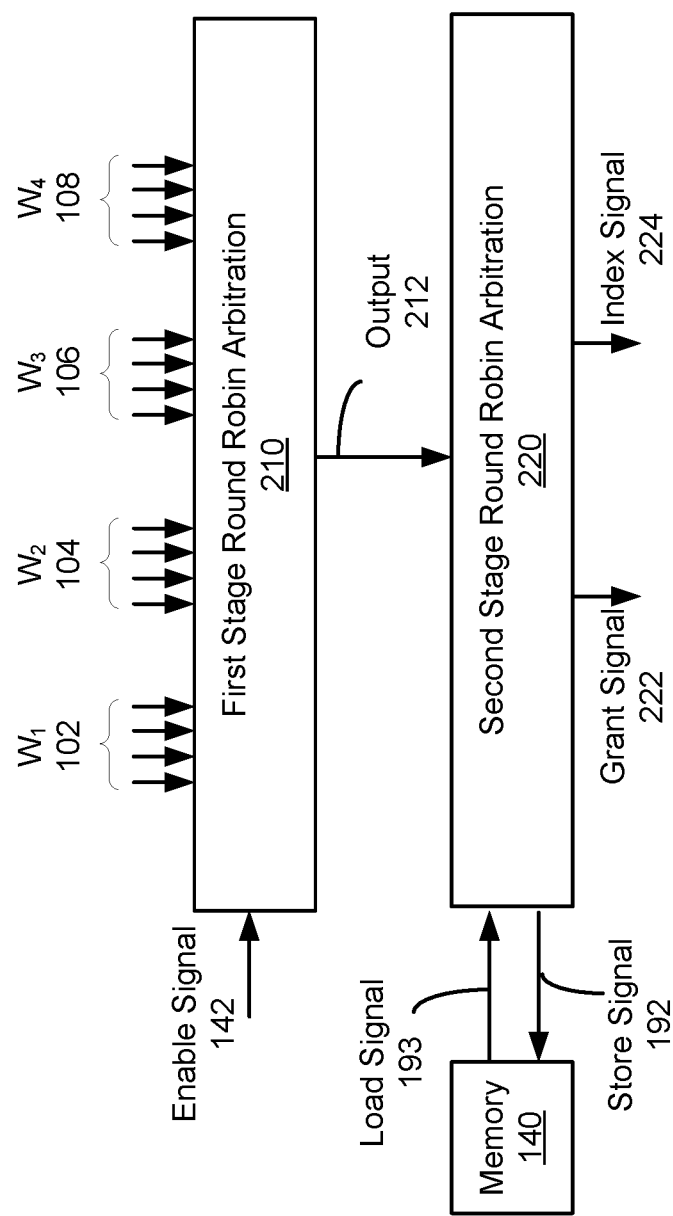

Referring now to FIGS. 2A-2B, illustrative two stage arbitration architecture, according to some examples is shown. Referring to FIG. 2A, a two stage round robin arbitration architecture is shown. In this embodiment, a first stage round robin arbitration 210 and a second stage round robin arbitration 220 are shown. The first stage round robin arbitration 210 receives a plurality of words similar to that of FIG. 1A. The first stage round robin arbitration 210 selects a word between the received words where the selected word has at least one request signal that is asserted high indicating that its corresponding component is requesting access to a common resource. For example, the first word with at least one request signal being asserted high may be $W_3$ 106. As such, words $W_1$ 102 and $W_2$ 104 are skipped. Once the word is selected, e.g., $W_3$ 106, the signal 212 is output similar to the one described in FIGS. 1A-1B.

The signal 212 is input into the second stage round robin arbitration 220 such that the selected word can be processed. The second stage round robin arbitration 220 processes the received word and grants access to the component requesting access to the common resource. As such, the second stage round robin arbitration 220 outputs index signals 224, corresponding a component within the word $W_3$ 106 that is requesting access to the common resource and it further outputs the grant signal 222 to grant access.

In the meantime, the first stage round robin arbitration 210 processes the next word with at least one request signal being asserted high indicating that at least one component corresponding to the request signal is requesting access to the common resource, e.g., $W_4$ 108. Signal 212 from the first stage round robin arbitration 210 is input to the second stage round robin arbitration 220. The second stage round robin arbitration 220 outputs index signal 224, corresponding to a component within the word $W_4$ 108 that is requesting access to the common resource and it further outputs the grant signal 222 to grant access.

In the meantime, the first stage round robin arbitration 210 processes the next word with at least one request signal being asserted high, as described above. For example, the first stage round robin arbitration 210 may process $W_3$ 106 again. Signal 122 from the first stage round robin arbitration 210 is input to the second stage round robin arbitration 220. The second stage round robin arbitration 220 outputs index signal 224, corresponding to a component within the word $W_3$ 106 that is requesting access to the common resource and it further outputs the grant signal 222 to grant access. It is appreciated that the process as described above is repeated until all request signals that are asserted high from all users are processed. It is further appreciated that the architecture described above processes one request signal that is asserted high from one user before processing another request signal that is asserted high from another user, and so and so forth, and it loops back to the first user that was processed and so on until all request signals that are asserted high from all users are processed. It is appreciated that while the embodiments described processing one request that is asserted for one user before processing another request that is asserted high from another user, the embodiments should not be construed as limited thereto. For example, in some embodiments, two request signals that are asserted high from the same user may be processed first before processing another two request signals from another user that are asserted high and so and so forth.

It is appreciated that the request signals within the word that are not asserted high indicate that the corresponding component is not requesting access to the common resource and it is skipped. It is further appreciated that the architecture shown is configured to track which request signal from which user has been processed such that in subsequent iterations the next request signal from the same user that is asserted high can be processed.

Referring now to FIG. 2B the architecture similar to FIG. 2A is shown with the mechanism to track which request signal from which user has been processed similar to FIG. 1B. The architecture shown in FIG. 2B operates substantially similar to that of FIG. 2A with the memory component 140, store signal 195 and load 193 as described in FIG. 1B.

Figure 3:
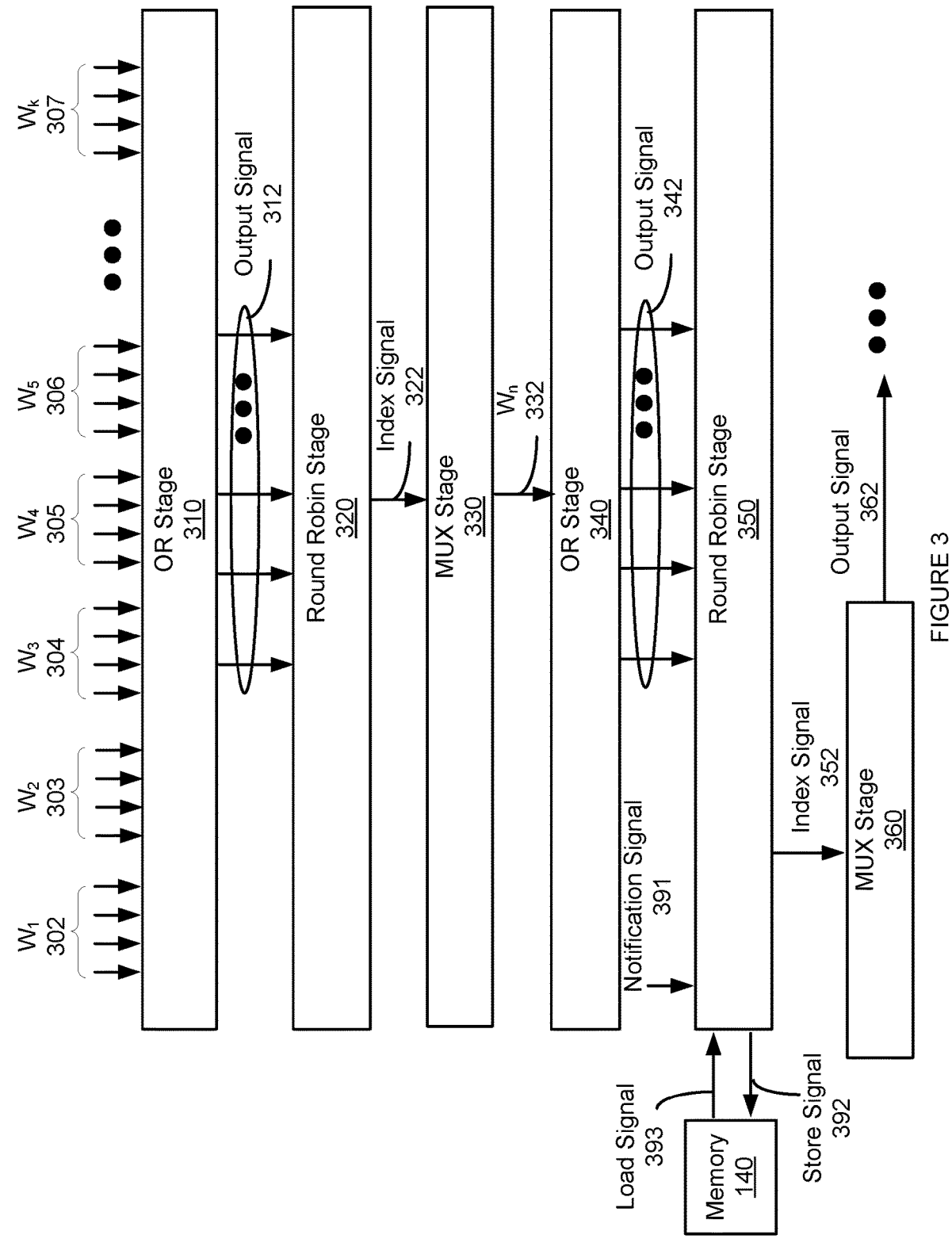
FIG. 3 shows a multistage arbitration architecture, according to some examples.

Referring now to FIG. 3, a multistage arbitration architecture, according to some examples is shown. FIG. 3 is similar to that of FIGS. 1A-1B, as described above. However, in FIG. 3 multiple stages are used. In this embodiment, the OR stage 310 is similar to the logical OR gates 192-198 and it receives words, $W_1$ 302, $W_2$ 303, $W_3$ 304, $W_4$ 305, $W_5$ 306, . . . , $W_k$ 307 where each word has multiple request signals that correspond to various components associated with each user. Each word may be m bits and therefore kxm request signals are received. The OR stage 310 output signals 312, similar to the outputs from the logical OR gates 192-198 in FIGS. 1A-1B. The output signals 312 are input to the round robin stage 320 that functions substantially similar to the round robin arbiter 110. The round robin stage 320 outputs an index signal 322 similar to the round robin arbiter 110. The MUX stage 330 functions similar to the multiplexer 120 and selects a word from the received words based on the index signal 322. The OR stage 340 splits the selected word $W_n$ 332 into a number of subwords, e.g., p words, each with q number of request signals. As such, the OR stage 340 outputs the subwords to round robin stage 350 that selects one of the subwords for processing. The index signal 352 identifying the subword is input to the MUX stage 360 that operates substantially similar to MUX stage 330. MUX stage 360 generates the output signal 362 and the process continues until the last round robin stage. The last round robin stage processes the words split into smaller words by prior stages, as described, to grant access to the common resource for a requesting signal within the split of small words received. Once the request signal is processed within the small word, the process returns to prior stage to select a different word and the process continues until a request signal with each word is ultimately processed. Then the process continues as described above to process other request signals within each word and the process continues until all request signals from all users are processed.

It is appreciated that each round robin stage receives a notification signal from a previous round robin stage. For example, round robin stage 350 receives the notification signal 391 from a round robin stage (not shown) that is prior to the round robin stage 350. Similarly, the round robin stage (not shown) that is prior to the round robin stage 350 receives the notification signal 391 from round robin stage 320. The notification signal operates substantially similar to that described in FIGS. 1A-1B. Moreover, each round robin stage has a corresponding memory 140 to store signal 392 wherein the stored signal 392 is loaded onto the corresponding round robin stage in order to keep track of the request signal associated with each user that was processed, as described in FIG. 1B. In one alternative embodiment, the same memory 140 may be used to store signal 392 and to load signal 393 into the appropriate round robin stage.

It is appreciated that the embodiments described in FIGS. 2 and 3 can be used for additional granularity for round robin processing. For example, a 3 stage round robin arbitration architecture can be used in order to process request signals from different networks, different users within each network, and each user having multiple request signals, as an example.

Figure 4A:
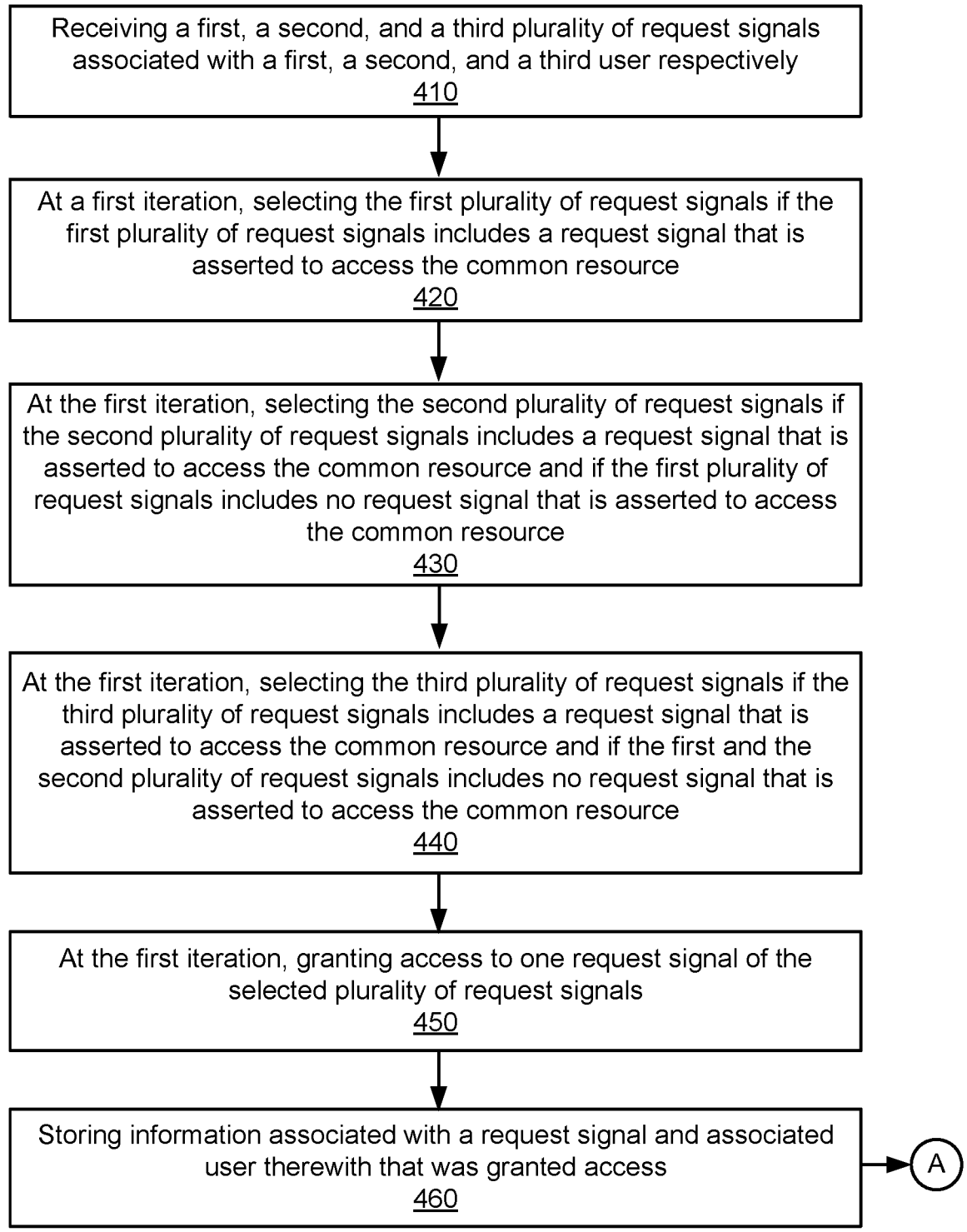
FIGS. 4A-4C show a flow chart of an arbitration architecture, according to some examples.
Figure 4B:
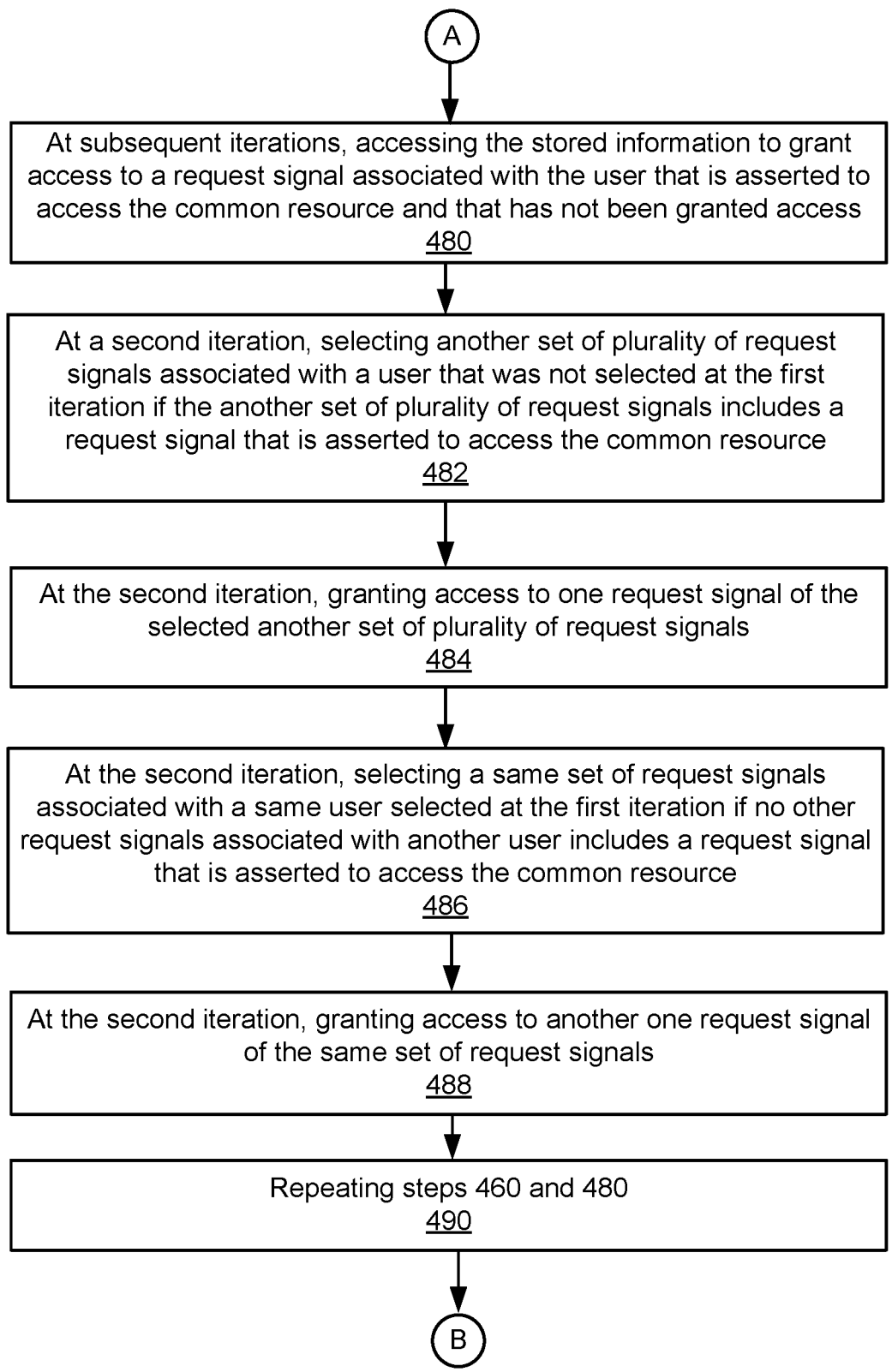
Figure 4C:
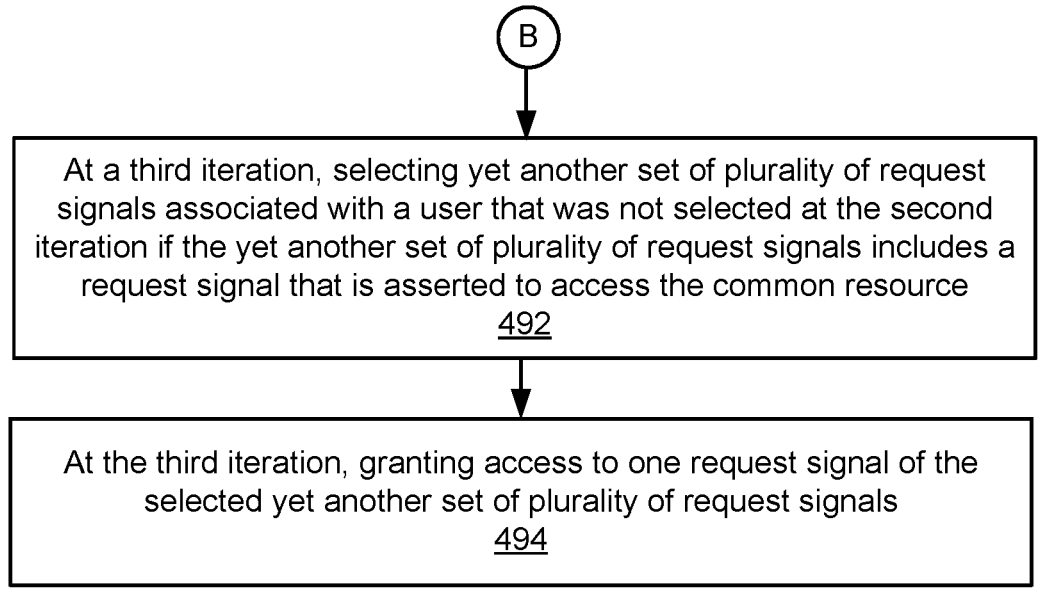

Referring now to FIGS. 4A-4C, a flow chart of an arbitration architecture, according to some examples is shown. At step 410, a first, a second, and a third plurality of request signals associated with a first, a second, and a third user, respectively are received, as described above with respect to FIGS. 1A-3. At a first iteration, the first plurality of request signals associated with the first user is selected if it includes at least a request signal that is asserted to access the common resource, at step 420. At the first iteration, the second plurality of request signals associated with the second user is selected if it includes at least a request signal that is asserted to access the common resource and if the first plurality of request signals includes no request signal that is asserted to access the common resource, at step 430. At the first iteration, the third plurality of request signals associated with the third user is selected if it includes at least a request signal that is asserted to access the common resource and if the first and the second plurality of request signals include no request signal that is asserted to access the common resource, at step 440. One request signal of the selected plurality of request signals is granted access to the common resource at step 450. At step 460, information associated with the request signal that was granted access to the common resource is stored, e.g., the request signal index, the user associated with the request signal, etc. As such, the information may be tracked such that the same request signal is not granted access more than once.

Referring now to FIG. 4B, at step 480, the stored information is accessed to ensure that the request signal that was granted access is not granted access again and to ensure that the next request signal asserted to access the common resource is granted access. At a second iteration, at step 482, another set of plurality of request signals associated with a user that was not selected at the first iteration is selected if the another set of plurality of request signals includes a request signal that is asserted to access the common resource. For example, if the first plurality of request signals was selected at the first iteration, then the second plurality of request signals may be selected if it includes at least one request signal that is asserted to access the common resource. Similarly, if the first plurality of request signals was selected at the first iteration, then the third plurality of request signals may be selected if it includes at least one request signal that is asserted to access the common resource. At step 484, one request signal from the selected request signals is granted access to the common resource. At the second iteration, the same set of request signals as the first iteration may be selected if no other request signals associated with other users include a request signal that is asserted to access the common resource, as shown in step 486. At the second iteration, another one request signal of the selected request signals, e.g., same request signals as selected in the first iteration, is granted access to the common resource, as shown in step 488. At step 490, steps 460 and 480 are repeated for the request signal that was granted access in step 484 or 488.

Referring now to FIG. 4C, at a third iteration, at step 492, another set of plurality of request signals associated with a different user that was not selected in the second iteration is selected if the another set of plurality of request signals include at least one request signal that is asserted to access a common resource. At step 494, at the third iteration, access to the common resource is granted to one request signal of the request signals selected at step 492.

Accordingly, the request signals for users are processed and granted access to the common resource in a round robin fashion. In other words, one request signal of one user is granted access, followed by one request signal of another user, and so forth until at least one request signal for each user having at least one request signal asserted is granted access before the process is looped back to the first user that was granted access. The process repeats until all request signals are granted access to the common resource.

Figure 5:
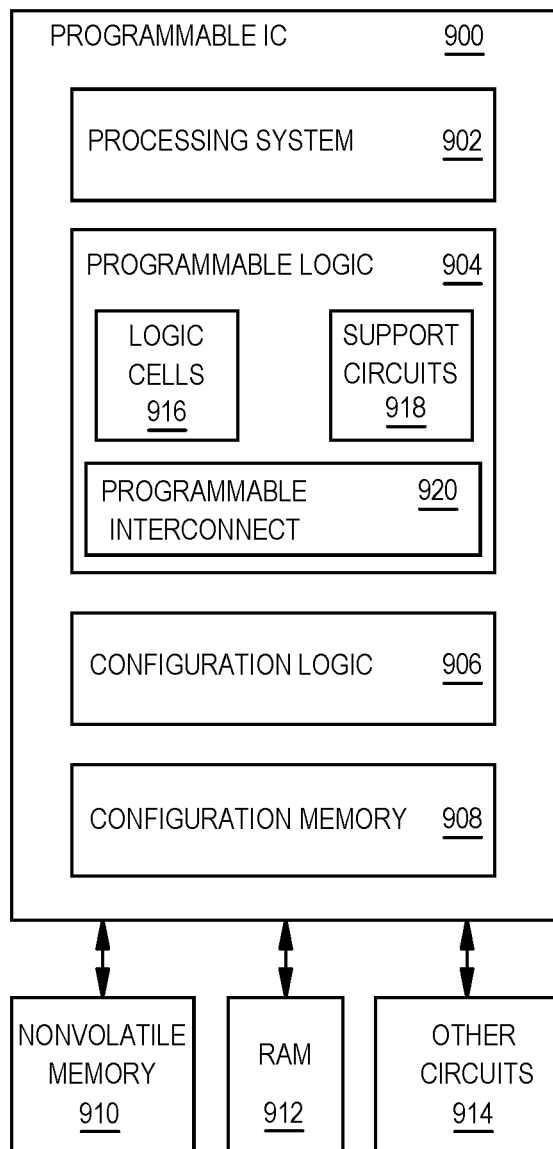
FIG. 5 is a block diagram depicting a programmable integrated circuit (IC), according to some examples.

FIG. 5 is a block diagram depicting a programmable integrated circuit (IC) 900 according to an example. The programmable IC 900 can implement the integrated circuit (IC) chip of systems of FIGS. 1A-4C, in whole or in part. The programmable IC 900 includes a processing system 902, programmable logic 904, configuration logic 906, and configuration memory 908. The programmable IC 900 can be coupled to external circuits, such as nonvolatile memory 910, RAM 912, and other circuits 914.

In the example of FIG. 5, the processing system 902 can include microprocessor(s), memory, support circuits, IO circuits, and the like. The programmable logic 904 includes logic cells 916, support circuits 918, and programmable interconnect 920. The logic cells 916 include circuits that can be configured to implement general logic functions of a plurality of inputs. The support circuits 918 include dedicated circuits, such as transceivers, input/output blocks, digital signal processors, memories, and the like. The logic cells and the support circuits 918 can be interconnected using the programmable interconnect 920. Information for programming the logic cells 916, for setting parameters of the support circuits 918, and for programming the programmable interconnect 920 is stored in the configuration memory 908 by the configuration logic 906. The configuration logic 906 can obtain the configuration data from the nonvolatile memory 910 or any other source (e.g., the RAM 912 or from the other circuits 914).

Figure 6:
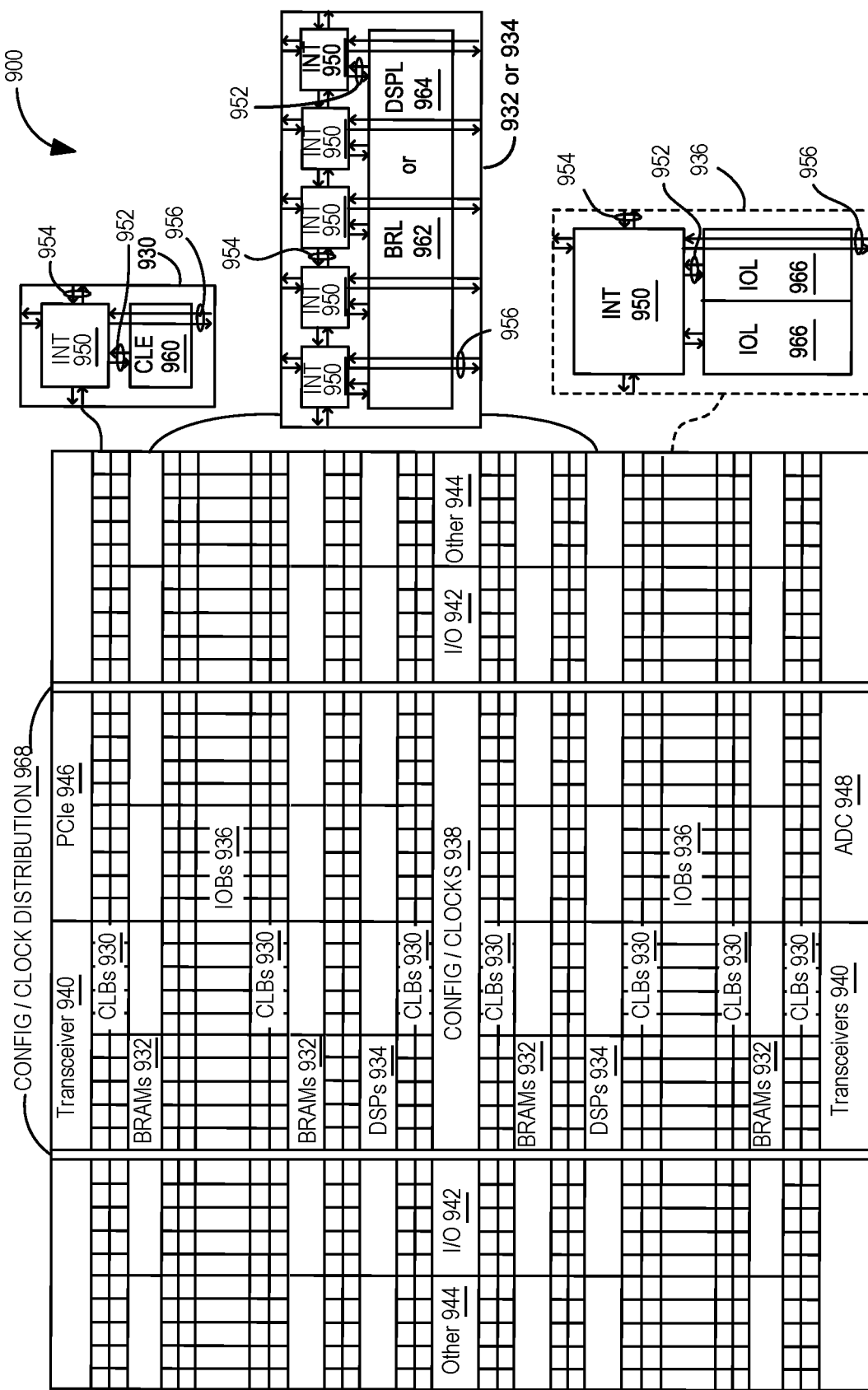
FIG. 6 is a field programmable gate array (FPGA) implementation of the programmable IC, according to some examples.

FIG. 6 illustrates an FPGA implementation of the programmable IC 900 that includes a large number of different programmable tiles including configurable logic blocks ("CLBs") 930, random access memory blocks ("BRAMs") 932, signal processing blocks ("DSPs") 934, input/output blocks ("IOBs") 936, configuration and clocking logic ("CONFIG/CLOCKS") 938, digital transceivers 940, specialized input/output blocks ("I/O") 942 (e.g., configuration ports and clock ports), and other programmable logic 944 such as digital clock managers, system monitoring logic, and so forth. The FPGA can also include PCIe interfaces 946, analog-to-digital converters (ADC) 948, and the like.

In some FPGAs, each programmable tile can include at least one programmable interconnect element ("INT") 950 having connections to input and output terminals 952 of a programmable logic element within the same tile, as shown by examples included in FIG. 6. Each programmable interconnect element 950 can also include connections to interconnect segments 954 of adjacent programmable interconnect element(s) in the same tile or other tile(s). Each programmable interconnect element 950 can also include connections to interconnect segments 956 of general routing resources between logic blocks (not shown). The general routing resources can include routing channels between logic blocks (not shown) comprising tracks of interconnect segments (e.g., interconnect segments 956) and switch blocks (not shown) for connecting interconnect segments. The interconnect segments of the general routing resources (e.g., interconnect segments 956) can span one or more logic blocks. The programmable interconnect elements 950 taken together with the general routing resources implement a programmable interconnect structure ("programmable interconnect") for the illustrated FPGA.

In an example implementation, a CLB 930 can include a configurable logic element ("CLE") 960 that can be programmed to implement user logic plus a single programmable interconnect element ("INT") 950. A BRAM 932 can include a BRAM logic element ("BRL") 962 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 934 can include a DSP logic element ("DSPL") 964 in addition to an appropriate number of programmable interconnect elements. An IOB 936 can include, for example, two instances of an input/output logic element ("IOL") 966 in addition to one instance of the programmable interconnect element 950. As will be clear to those of skill in the art, the actual I/O pads connected, for example, to the input/output logic element 966 typically are not confined to the area of the input/output logic element 966.

In the pictured example, a horizontal area near the center of the die is used for configuration, clock, and other control logic. Vertical columns 968 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A device comprising:
   logical gates, each logical gate of the logical gates corresponding to a respective user and configured to receive a plurality of request signals indicative of whether the respective user requests access to a resource and to responsively output a user request indication signal indicating whether the respective user requests access to the resource;
   a first round robin arbiter configured to:
      receive the user request indication signals from the logical gates; and
      output, when one or more of the user request indications signals indicate that a respective user requests access to the resource, an index signal corresponding to a respective one of the user request indication signals using a round robin arbitration scheme;
   a multiplexer configured to receive a respective plurality of request signals from each user when the respective user requests access to the resource, the multiplexer being configured to output a plurality of request signals from a respective user based on the index signal; and
   a second round robin arbiter configured to receive the plurality of request signals from the multiplexer and grant access to a first request signal of the plurality of request signals to the resource before receiving a subsequent plurality of request signals output from the multiplexer, wherein the subsequent plurality of request signals is received before a second request signal of the plurality of request signals is granted access to the resource, and wherein the first request signal and the second request signal are asserted to access the resource.

2. The device of claim 1, wherein each of the logical gates comprises a logical OR gate.

3. The device of claim 1 further comprising a memory configured to store data associated with the first request signal that has been granted access to the resource, and wherein the second round robin arbiter is configured to access the stored data and to grant access to the second request signal to the resource.

4. The device of claim 3, wherein the memory is further configured to store data associated with the first request signal in response to the first request signal being granted access to the resource, and wherein the second round robin arbiter is configured to access the stored data and to grant access to the second request signal to the resource based on the stored data.

5. The device of claim 4, wherein the another one request signal of the subsequent plurality of request signals that is asserted to access the resource is a request signal that has not been granted access to the resource and is waiting for access grant.

6. The device of claim 1, wherein the first round robin arbiter is configured to receive an enable signal to initiate round robin arbitration, and wherein the first round robin arbiter is configured to output a notification signal to the second round robin arbiter to notify the second round robin arbiter that the first round robin arbiter has completed a current round robin arbitration processing and to initiate a round robin processing by the second round robin arbiter.

7. The device of claim 1, wherein the resource is selected from a group consisting of a bus, storage memory, and network cards.

8. A device comprising:
    first stage round robin arbitration configured to:
        receive a first plurality of request signals associated with a first user, and a second plurality of request signals associated with a second user, the first plurality of request signals comprising a first request signal and a second request signal asserted to access a resource, and the second plurality of request signals comprises a third request signal asserted to access a resource; and
        select, using a round robin arbitration scheme, the first user during a first iteration and a third iteration, and the second user during a second iteration, wherein the second iteration occurs between the first iteration and the third iteration; and
    a second stage round robin arbitration configured to:
        receive the first plurality of request signals in response to the first stage round robin arbitration selecting the first user, and the second plurality of request signals in response to the first stage round robin arbitration selecting the second user; and
        grant, using a round robin arbitration scheme, access to the first request signal to the resource, access to the third request signal to the resource, and access to the second request signal to the resource, wherein the third request signal is granted access to the resource after the first request signal and before the second request signal.

9. The device of claim 8, wherein the first stage round robin arbitration is configured to select a third user after the second iteration and before the third iteration if a third plurality of request signals associated with the third user includes a request signal that is asserted and has not been granted access to the resource, and wherein the second stage round robin arbitration is further configured to grant access to the request signal of the third plurality of request signals that is asserted and has not been granted access.

10. The device of claim 8 further comprising a memory configured to store data associated with a request signal that was granted access to the resource by the second stage round robin arbitration, and wherein the second stage round robin arbitration is configured to access the stored data and to grant access to a next request signal associated with a user that is asserted to access the resource, wherein the next request signal is different from prior request signals that were granted access to the resource.

11. The device of claim 8, wherein the first stage round robin arbitration comprises:
    a plurality of logical gates configured to receive the first and the second plurality of request signals and output a plurality of logical output signals, wherein each logical gate of the plurality of logical gates receives a plurality of request signals associated with one user;
    a round robin arbiter configured to receive the plurality of logical output signals and select one logical output at a time in a round robin fashion that includes a request signal that is asserted to access the resource; and
    a multiplexer configured to receive the selection by the round robin arbiter and transmit the plurality of request signals corresponding to the selection to the second stage round robin arbitration.

12. The device of claim 11, wherein the plurality of logical gates includes a logical OR gate.

13. The device of claim 8, wherein the resource is selected from a group consisting of a bus, storage memory, and network cards.

14. The device of claim 8, wherein the first stage round robin arbitration transmits a notification signal to the second stage round robin arbitration to notify the second stage round robin arbitration that the first stage round robin arbitration has completed a current round robin arbitration processing and to initiate a round robin processing by the second stage round robin arbitration.

15. A method comprising:
    receiving, at a first round robin arbitration, a first plurality of request signals associated with a first user, and a second plurality of request signals associated with a second user, the first plurality of request signals comprising a first request signal and a second request signal asserted to access a resource, and the second plurality of request signals comprises a third request signal asserted to access a resource;
    selecting, by the first round robin arbitration and using a round robin arbitration scheme, the first user during a first iteration and a third iteration, and the second user during a second iteration, wherein the second iteration occurs between the first iteration and the third iteration;
    receiving, at a second round robin arbitration, the first plurality of request signals in response to the selection the first user, and the second plurality of request signal in response to the selection of the second user; and
    granting, by the second round robin arbitration and using a round robin arbitration scheme, access to the first request signal to the resource, access to the third request signal to the resource, and access to the second request signal to the resource, wherein the third request signal is granted access to the resource after the first request signal and before the second request signal.

16. The method of claim 15 further comprising:
selecting a third plurality of request signals associated with a third user; and
granting access to one request signal of the third plurality of request signals to the resource after the third request signal is granted access to the resource and before the second request signal is granted access to the resource.

17. The method of claim 15 further comprising:
selecting the first plurality of request signals after granting access to the second request signal in response to no other request signal of the second plurality of request signals being asserted to access the resource; and
granting access to a fourth request signal of the first plurality of request signals.

18. The method of claim 15 further comprising:
storing information associated with the first request signal and the first user that was granted access; and
accessing the stored information to grant access to the second request signal based on the stored information.

19. The method of claim 15, wherein the resource is selected from a group consisting of a bus, storage memory, and network cards.

\* \* \* \* \*